(12) United States Patent
Robert et al.

(10) Patent No.: US 7,943,109 B2
(45) Date of Patent: May 17, 2011

(54) PROCESS FOR THE PRODUCTION OF SI BY REDUCTION OF SICL$_4$ WITH LIQUID ZN

(75) Inventors: Eric Robert, Liège (BE); Tjakko Zijlema, Rotselaar (BE)

(73) Assignee: Umicore, Brussels (BE)

( * ) Notice: Subject to any disclaimer, the term of this patent is extended or adjusted under 35 U.S.C. 154(b) by 0 days.

(21) Appl. No.: 11/909,353

(22) PCT Filed: Mar. 24, 2006

(86) PCT No.: PCT/EP2006/002937
§ 371 (c)(1),
(2), (4) Date: Jan. 18, 2008

(87) PCT Pub. No.: WO2006/100114
PCT Pub. Date: Sep. 28, 2006

(65) Prior Publication Data
US 2008/0181836 A1    Jul. 31, 2008

Related U.S. Application Data

(60) Provisional application No. 60/665,352, filed on Mar. 28, 2005.

(30) Foreign Application Priority Data

Mar. 24, 2005  (EP) .................................. 05075701
Jul. 7, 2005    (EP) .................................. 05076550

(51) Int. Cl.
*C01B 33/02* (2006.01)
(52) U.S. Cl. ......................... 423/350; 423/107
(58) Field of Classification Search .................. 423/350, 423/107
See application file for complete search history.

(56) References Cited

U.S. PATENT DOCUMENTS

| 2,773,745 | A | | 12/1956 | Butler et al. |
| 2,804,377 | A | | 8/1957 | Olson |
| 2,805,934 | A | * | 9/1957 | McKinley ....................... 75/663 |
| 2,909,411 | A | | 10/1959 | Krchma |
| 3,000,726 | A | * | 9/1961 | Speeding et al. ............... 75/395 |
| 3,041,145 | A | | 6/1962 | Aries |
| 4,225,367 | A | * | 9/1980 | Anglerot ......................... 438/97 |
| 4,239,740 | A | | 12/1980 | Harvey, II et al. |
| 4,604,272 | A | * | 8/1986 | Kratel et al. .................. 423/343 |
| 4,755,370 | A | * | 7/1988 | Kray et al. .................... 423/342 |

FOREIGN PATENT DOCUMENTS

| JP | 11-011925 | | 1/1999 |
| JP | 11011925 A | * | 1/1999 |
| JP | 11-092130 | | 4/1999 |
| WO | WO 01/04388 | | 1/2001 |

OTHER PUBLICATIONS

Photovoltaic Technology: The Case for Thin-Film Solar Cells A. Shah, P. Torres, R. Tscharner, N. Wyrsch, and H. Keppner (Jul. 30, 1999) Science 285 (5428), 692. [DOI: 10.1126/science.285.5428.692].*

* cited by examiner

*Primary Examiner* — Stuart Hendrickson
*Assistant Examiner* — Richard M Rump
(74) *Attorney, Agent, or Firm* — Brinks, Hofer, Gilson & Lione

(57) ABSTRACT

The invention relates to the manufacture of high purity silicon as a base material for the production of e.g. crystalline silicon solar cells. SiCl$_4$ is converted to Si metal by contacting gaseous SiCl$_4$ with liquid Zn, thereby obtaining a Si-bearing alloy and Zn-chloride, which is separated. The Si-bearing alloy is then purified at a temperature above the boiling point of Zn. This process does not require complicated technologies and preserves the high purity of the SiCl$_4$ towards the end product, as the only reactant is Zn, which can be obtained in very high purity grades and continuously recycled.

19 Claims, No Drawings

PROCESS FOR THE PRODUCTION OF SI BY REDUCTION OF SICL$_4$ WITH LIQUID ZN

This application is a National Stage application of International Application No. PCT/EP2006/002937, filed Mar. 24, 2006, which claims the benefit of U.S. Provisional Application No. 60/665,352, filed Mar. 28, 2005, and European Patent Application No. 05075701.2, filed Mar. 24, 2005, and European Patent Application No. 05076550.2 filed Jul. 7, 2005, the entire contents of each is hereby incorporated herein by reference.

The invention relates to the manufacture of solar grade silicon (Si) as a feedstock material for the manufacture of crystalline silicon solar cells. The Si metal is obtained by direct reduction of SiCl$_4$, a precursor that is commonly available in high purity grades.

Silicon suitable for application in solar cells is commonly manufactured by the thermal decomposition of SiHCl$_3$ according to the Siemens process or its variants. The process delivers very pure silicon, but it is slow, highly energy consuming, and requires large investments.

An alternative route towards the formation of Si for solar cells is the reduction of SiCl$_4$ with metals such as Zn. This process has the potential for significant cost reduction because of lower investment costs and reduced energy consumption.

The direct reduction of SiCl$_4$ by Zn in the vapor phase is described in U.S. Pat. No. 2,773,745, U.S. Pat. No. 2,804,377, U.S. Pat. No. 2,909,411 or U.S. Pat. No. 3,041,145. When Zn vapor is used, a granular silicon product is formed in a fluidized bed type of reactor, enabling easier Si separation. However, an industrial process based on this principle is technologically complex.

The direct reduction of SiCl$_4$ with liquid Zn is described in JP 11-092130 and JP 11-011925. Si is formed as a fine powder and separated from the liquid Zn by entraining it with the gaseous ZnCl$_2$ by-product. This process is however not practical because the selection of operating conditions leading to the entrainment of a major part of the Si with the gaseous flux appears to be critical. Also, the subsequent separation of the fine Si powder from the ZnCl$_2$ is problematic as well as the handling and melting of the fine Si powder. The ZnCl$_2$ has moreover to be vaporized twice, leading to a poor global energetic efficiency of the process.

It is an object of the present invention to provide a solution for the problems in the prior art.

To this end, according to this invention, high purity Si metal is obtained by a process for converting SiCl$_4$ into Si metal, comprising the steps of:
  contacting gaseous SiCl$_4$ with a liquid metal phase containing Zn, thereby obtaining a Si-bearing metal phase and Zn-chloride;
  separating the Zn-chloride from the Si-bearing metal phase; and
  purifying the Si-bearing metal phase at a temperature above the boiling point of Zn, thereby vaporizing Zn and obtaining Si metal.

The contacting and the separating steps are performed in a single reactor. This is rendered possible by the fact that a major part (more than 50% by weight) of the formed Si is retained in the liquid metal phase.

It is useful to combine the contacting and the separating steps, by operating the contacting step at a temperature above the boiling point of Zn-chloride, which evaporates. The Zn-chloride can be permitted to escape so as to be collected for further processing.

The Si-bearing metal phase as obtained in the contacting step, can advantageously contain, besides Si as solute, also at least some Si in the solid state, e.g. as suspended particles. Formation of particular Si may indeed occur during the contacting step, when the Zn metal gets saturated in Si. Solid state Si can also be obtained by cooling the Si-bearing metal phase as obtained in the contacting step, preferably to a temperature of between 420 and 600° C. The solid state Si can preferably be separated from the bulk of the molten phase, e.g. after settling. This Si metal phase is however still impregnated with Zn and has to be further processed in the purification step.

It is advantageous to perform the contacting step by blowing SiCl$_4$ into a bath comprising molten Zn at a flow rate adapted to limit the loss of Si by entrainment with evaporating Zn-chloride, to less than 15% (weight). To this end, a flow rate of SiCl$_4$ below 0.8 kg/min per m$^2$ of bath surface is suitable. Much higher rates, up to 10 kg/min per m$^2$ of bath surface but preferably limited to 2 kg/min per m$^2$, are however compatible with the abovementioned low Si losses, if the gaseous SiCl$_4$ is dispersed in the bath. Adequate dispersion can be obtained using e.g. multiple submerged nozzles, a submerged nozzle equipped with a porous plug, a rotating dispersion device, or any combination of these means. The SiCl$_4$ can be injected along with a carrier gas such as N$_2$.

It is useful to operate the purification step at a temperature above the melting point of Si, and, in particular, at reduced pressure or under vacuum. The purification can advantageously be performed in again the same reactor as the first two process steps.

It is also advantageous to recycle one or more of the different streams which are not considered as end-products:
  the obtained Zn-chloride can be subjected to molten salt electrolysis, thereby recovering Zn, which can be recycled to the SiCl$_4$ reduction step, and chlorine, which can be recycled to a Si chlorination process for the production of SiCl$_4$;
  Zn that is vaporized in the purification step can be condensed and recycled to the SiCl$_4$ converting process; and/or- the fraction of SiCl$_4$ that exits the contacting step un-reacted can be recycled to the SiCl$_4$ converting process, e.g. after condensation.

According to this invention, SiCl$_4$ is reduced with liquid Zn. The technology for this process is therefore much more straightforward than that required for the gaseous reduction process. A Si-bearing alloy containing both dissolved and solid Si can be obtained, while the chlorinated Zn either forms a separate liquid phase, containing most of the solid Si, or is formed as a vapor. Zn can be retrieved from its chloride, e.g. by molten salt electrolysis, and reused for SiCl$_4$ reduction. The Si-bearing alloy can be purified at high temperatures, above the boiling points of both Zn and Zn-chloride, but below the boiling point of Si itself (2355° C.). The evaporated Zn can be retrieved and reused for SiCl$_4$ reduction. Any other volatile element is also removed in this step. It is thus possible to close the loop on Zn, thereby avoiding the introduction of impurities into the system through fresh additions.

It should be noted that besides Zn, another metal could also be used that forms chlorides more stable than SiCl$_4$, that can be separated from Si easily and that can be recovered from its chloride without difficulty.

In a preferred embodiment according to the invention, gaseous SiCl$_4$ is contacted with liquid Zn at atmospheric pressure, at a temperature above the boiling point of ZnCl$_2$ (732° C.) and below the boiling point of Zn (907° C.). The preferred operating temperature is 750 to 880° C., a range ensuring sufficiently high reaction kinetics, while the evaporation of metallic Zn remains limited.

In a typical embodiment, the molten Zn is placed in a reactor, preferably made of quartz or of another high purity material such as graphite. The $SiCl_4$, which is liquid at room temperature, is injected in the zinc via a submerged tube. The injection is performed at the bottom of the Zn-containing vessel. The $SiCl_4$, which is heated in the tube, is actually injected as a gas. The end of the injection tube is provided with a dispersion device such as a porous plug or fritted glass. It is indeed important to have a good contact between the $SiCl_4$ and the Zn to get a high reduction yield. If this is not the case, partial reduction to $SiCl_2$ could occur, or $SiCl_4$ could leave the zinc un-reacted. With an adequate $SiCl_4$—Zn contact, close to 100% conversion is observed. Finely dispersing the $SiCl_4$ has been demonstrated to be a major factor in limiting the entrainment of finely dispersed Si with the gaseous flow.

The reduction process produces $ZnCl_2$. It has a boiling point of 732° C., and is gaseous at the preferred operating temperature. It leaves the Zn-containing vessel via the top. The vapors are condensed and collected in a separate crucible.

The process also produces reduced Si. The Si dissolves in the molten Zn up to its solubility limit. The Si solubility in the Zn increases with temperature and is limited to about 4% at 907° C., the atmospheric boiling point of pure Zn.

In a first advantageous embodiment of the invention, the amount of $SiCl_4$ injected is such that the solubility limit of Si in Zn is exceeded. Solid, particulate Si is produced, which may remain in suspension in the molten Zn bath and/or aggregate so as to form dross. This results in a Zn metal phase with a total (dissolved, suspended and drossed) mean Si concentration of preferably more than 10%, i.e. considerably higher than the solubility limit, and thus in a more efficient and economic Si purification step. Any particulate Si is however subject to losses by entrainment with the $ZnCl_2$ gaseous stream. This risk can be minimized by using a sufficiently low $SiCl_4$ flow and/or means ensuring the dispersion of the $SiCl_4$ into the Zn melt. A Si loss by entrainment of less than 15% of the total Si input to the process is considered as acceptable.

In a second advantageous embodiment according to the invention, the Si-bearing alloy is allowed to cool down to a temperature somewhat above the melting point of the Zn, e.g. 600° C. A major part of the initially dissolved Si crystallizes upon cooling, and accumulates together with any solid Si that was already present in the bath, in an upper solid fraction. The lower liquid fraction of the metal phase is Si-depleted, and can be separated by any suitable means, e.g. by pouring. This metal can be directly re-used for further $SiCl_4$ reduction. The upper Si-rich fraction is then subjected to the purification as mentioned above, with the advantage that the amount of Zn to be evaporated is considerably reduced.

Both of the above first and second advantageous embodiments can of course be combined.

When the purification step is performed above the melting point of Si, the molten silicon can be solidified in a single step, chosen from the methods of crystal pulling such as the Czochralski method, directional solidification and ribbon growth. The ribbon growth method includes its variants, such as ribbon-growth-on-substrate (RGS), which directly yields RGS Si wafers.

Alternatively, the molten silicon can be granulated, the granules being fed to a melting furnace, preferably in a continuous way, whereupon the molten silicon can be solidified in a single step, chosen from the methods of crystal pulling, directional solidification and ribbon growth.

The solid material obtained can then be further processed to solar cells, directly or after wafering, according to the solidification method used.

The Zn, together with typical trace impurities such as Tl, Cd and Pb can be separated from the Si-bearing alloy by vaporization. Si with a purity of 5N to 6N is then obtained. For this operation, the temperature is increased above the boiling point of Zn (907° C.), and preferably above the melting point (1414° C.) but below the boiling point of Si (2355° C.). It is useful to work at reduced pressure or vacuum. The Zn and its volatile impurities are hereby eliminated from the alloy, leaving molten Si. Only the non-volatile impurities present in the Zn remain in the Si. Examples of such impurities are Fe and Cu. Their concentration can be minimized, either by pre-distilling the Zn, by repeatedly recycling the Zn to the $SiCl_4$ reduction step after electrolysis of the formed $ZnCl_2$, or by minimizing the amount of Zn that needs to be vaporized per kg of Si in the purification step. In such optimized conditions, a Si purity exceeding 6N could be achieved.

A further advantage of the invention is that the Si can be recovered in the molten state at the end of the purification process. Indeed, in the state-of the art Siemens process and its variants, the Si is produced as a solid that has to be re-melted to be fashioned into wafers by any of the commonly used technologies (crystal pulling or directional solidification). Directly obtaining the Si in the molten state allows for a better integration of the feedstock production with the steps towards wafer production, providing an additional reduction in the total energy consumption of the process as well as in the cost of the wafer manufacturing. The liquid Si can indeed be fed directly to an ingot caster or a crystal puller. Processing the Si in a ribbon growth apparatus is also possible.

If one does not wish to produce ready-to-wafer material, but only intermediate solid feedstock, it appears advantageous to granulate the purified Si. The obtained granules are easier to handle and to dose than the chunks obtained in e.g. the Siemens-based processes. This is particularly important in the case of ribbon growth technologies. The production of free flowing granules enables the continuous feeding of a CZ furnace or a ribbon growth apparatus.

EXAMPLE 1

The following example illustrates the invention. 4192 g of metallic Zn is heated to 850° C. in a graphite reactor. The height of the bath is about 15 cm and its diameter is 7 cm. A Minipuls™ peristaltic pump is used to introduce $SiCl_4$ in the reactor via a quartz tube. The immersed extremity of the tube is fitted with a porous plug made of alumino-silicate. The $SiCl_4$, which has a boiling point of 58° C., vaporizes in the immersed section of the tube and is dispersed as a gas in the liquid Zn. The $SiCl_4$ flow is ca. 150 g/h, and the total amount added is 1625 g. The flow rate corresponds to 0.65 kg/min per $m^2$ of bath surface. The $ZnCl_2$, which is formed during the reaction, evaporates and is condensed in a graphite tube connected to the reactor and is collected in a separate vessel. Any un-reacted $SiCl_4$ is collected in a wet scrubber connected to the $ZnCl_2$ vessel. A Zn—Si alloy, saturated in Si at the prevalent reactor temperature and containing additional solid particles of Si, is obtained. The total Si content of the mixture is 9%. It is sufficient to increase the amount of $SiCl_4$ added, at the same flow-rate of 150 g/h, to increase the amount of solid Si in the Zn—Si alloy. This Zn—Si alloy containing solid Si is heated to 1500° C. to evaporate the Zn, which is condensed and recovered. The Si is then allowed to cool down to room temperature; 229 g of Si are recovered.

The Si reaction yield is thus about 85%. The Si losses can be attributed to the entrainment of particles of Si with the escaping $ZnCl_2$ vapors, and to the incomplete reduction of $SiCl_4$ into Si metal. Of the remaining Si, about 40 g are found in the $ZnCl_2$ and 3 g in the scrubber.

EXAMPLE 2

This example illustrates the granulation of the molten silicon, a process which is particularly useful when the purification step is performed above the melting point of Si. One kg of molten silicon is contained in a furnace at 1520° C. The crucible containing the molten metal is under inert atmosphere (Ar). The furnace allows the crucible to be tilted, so as to pour the molten silicon into a vessel containing ultra-pure water at room temperature. The silicon readily forms granules of a size between 2 and 10 mm.

The invention claimed is:

1. Process for converting $SiCl_4$ into Si metal, comprising the steps of:
    contacting gaseous $SiCl_4$ with a liquid metal phase consisting of at least 96% Zn and up to 4% Si and obtaining a Si-bearing Zn alloy and Zn-chloride;
    separating the Zn-chloride from the Si-bearing Zn alloy;
    purifying the Si-bearing Zn alloy at a temperature above the boiling point of Zn, vaporizing said Zn; and
    recovering Si metal from the Si-bearing Zn alloy, wherein the contacting and the separation steps are performed in a single reactor.

2. The process according to claim 1, wherein the contacting and the separating steps are performed simultaneously at a temperature above the boiling point of Zn-chloride.

3. The process according to claim 1, wherein the Si-bearing Zn alloy that is obtained in the contacting step, contains at least part of the Si in the solid state.

4. The process according to claim 1, further comprising the step of cooling the Si-bearing Zn alloy before the purifying step, wherein at least part of the Si present as a solute in the Si-bearing Zn alloy obtained in the contacting step is converted to the solid state.

5. The process according to claim 4, wherein the cooling is at a temperature of between 420° C. and 600° C.

6. The process according to claim 3, wherein the Si present in the solid state is separated, forming the Si-bearing Zn alloy that is further processed in the purification step.

7. The process according to claim 1, wherein the contacting step is performed by blowing gaseous $SiCl_4$ into a bath consisting of molten Zn and Si at a flow rate adapted to limit the loss of Si by entrainment with evaporating Zn-chloride to less than 15%.

8. The process according to claim 7, whereby the flow rate of $SiCl_4$ is lower than 0.8 kg/min per $m^2$ of bath surface.

9. The process according to claim 1, wherein the purification step is performed at a temperature above the melting point of Si, wherein purified liquid Si is formed.

10. The process according to claim 9, wherein the purification step is performed at reduced pressure or under vacuum.

11. The process according to claim 1, further comprising the steps of:
    subjecting the separated Zn-chloride to molten salt electrolysis and recovering Zn and chlorine; and
    recycling the Zn to the $SiCl_4$ converting process.

12. The process according to claim 11, further comprising recycling the chlorine to a Si chlorination process for the production of $SiCl_4$.

13. The process according to claim 1, further comprising condensing the Zn that is vaporized in the purification step and recycling the Zn to the $SiCl_4$ converting process.

14. The process according to claim 1, further comprising recycling the fraction of $SiCl_4$ that exits the contacting step un-reacted to the $SiCl_4$ converting process.

15. The process according to claim 9, wherein the purification step further comprises a single solidification step selected from the group consisting of crystal pulling, directional solidification, and ribbon growth of the purified liquid Si.

16. The process according to claim 15, wherein the solid material is wafered and further processed to solar cells.

17. The process according to claim 9, further comprising granulation of the purified liquid Si.

18. The process according to claim 17, further comprising the steps of:
    feeding the granules of Si to a melting furnace; and
    applying a single solidification step to the liquid Si selected from the group consisting of crystal pulling, directional solidification, and ribbon growth.

19. The process according to claim 18, wherein the solid material is wafered and further processed to solar cells.

* * * * *

UNITED STATES PATENT AND TRADEMARK OFFICE
CERTIFICATE OF CORRECTION

| | | |
|---|---|---|
| PATENT NO. | : 7,943,109 B2 | Page 1 of 1 |
| APPLICATION NO. | : 11/909353 | |
| DATED | : May 17, 2011 | |
| INVENTOR(S) | : Eric Robert et al. | |

It is certified that error appears in the above-identified patent and that said Letters Patent is hereby corrected as shown below:

On the title page:
In the Title (Item 54) of the subject patent, please delete "SI" and insert in place thereof --Si--;
In the Title (Item 54) of the subject patent, please delete "SICL.sub.4" and insert in place thereof --SiCl.sub.4--;
In the Title (Item 54) of the subject patent, please delete "ZN" and insert in place thereof --Zn--.

Signed and Sealed this
Seventeenth Day of January, 2012

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,943,109 B2 | |
| APPLICATION NO. | : 11/909353 | |
| DATED | : May 17, 2011 | |
| INVENTOR(S) | : Eric Robert et al. | |

It is certified that error appears in the above-identified patent and that said Letters Patent is hereby corrected as shown below:

Title Page, Item (54) and at Column 1, lines 1 and 2, Title "PROCESS FOR THE PRODUCTION OF SI BY REDUCTION OF SICL4 WITH LIQUID ZN" should read -- PROCESS FOR THE PRODUCTION OF Si BY REDUCTION OF SiCl$_4$ WITH LIQUID Zn--.

This certificate supersedes Certificate of Correction issued January 17, 2012.

Signed and Sealed this
Fourteenth Day of February, 2012

David J. Kappos
*Director of the United States Patent and Trademark Office*